United States Patent [19]

Ohsawa et al.

[11] Patent Number: 5,786,239
[45] Date of Patent: Jul. 28, 1998

[54] METHOD OF MANUFACTURING A SEMICONDUCTOR PACKAGE

[75] Inventors: Kenji Ohsawa; Makoto Ito, both of Kanagawa, Japan

[73] Assignee: Sony Corporation, Tokyo, Japan

[21] Appl. No.: 717,419

[22] Filed: Sep. 20, 1996

[30] Foreign Application Priority Data

Sep. 20, 1995 [JP] Japan ................... 7-241965

[51] Int. Cl.$^6$ ................................. H01L 21/60
[52] U.S. Cl. ................ 438/123; 438/124; 438/613
[58] Field of Search .................... 437/183, 189, 437/211, 217, 224; 438/613, 124, 123

[56] References Cited

U.S. PATENT DOCUMENTS

| | | | |
|---|---|---|---|
| 3,801,388 | 4/1974 | Akiyama et al. | 174/68.5 |
| 4,209,355 | 6/1980 | Burns | 156/630 |
| 4,695,527 | 9/1987 | Geissler et al. | 430/256 |
| 4,973,562 | 11/1990 | Den Blanken | 437/189 |
| 5,223,454 | 6/1993 | Uda et al. | 437/189 |
| 5,316,894 | 5/1994 | Takahashi et al. | 430/313 |
| 5,336,650 | 8/1994 | Chikawa | 437/209 |
| 5,352,632 | 10/1994 | Sawaya | 437/209 |
| 5,559,372 | 9/1996 | Kwon | 257/692 |
| 5,633,535 | 5/1997 | Chao et al. | 257/778 |

FOREIGN PATENT DOCUMENTS

| | | | |
|---|---|---|---|
| 55-26613 | 2/1980 | Japan | 257/673 |
| 60-12749 | 1/1985 | Japan | 437/183 |
| 3-268340 | 11/1991 | Japan | 257/673 |
| 5-243465 | 9/1993 | Japan | 257/673 |

*Primary Examiner*—John Niebling
*Assistant Examiner*—Kevin F. Turner
*Attorney, Agent, or Firm*—Hill & Simpson

[57] ABSTRACT

According to a method of manufacturing a semiconductor package of the present invention, a plurality of leads and a large number of minute convex portions are respectively formed by plating on a surface of a metal base and in an outer peripheral area of the leads thereon. An insulative film for holding each of the leads is formed. A solder resist film is formed selectively on a portion including the outer peripheral area having the minute convex portions thereon. A projecting electrode is formed on an outer lead portion of each of the leads through an opening of the solder resist film on an outer lead portion of each of the leads. The metal base is selectively removed except a joint portion thereof on an outer periphery to separate the respective leads. Inner lead portions of the leads and a semiconductor chip are jointed together. The joint portion of the metal base is cut off.

10 Claims, 9 Drawing Sheets

METHOD OF MANUFACTURING A SEMICONDUCTOR PACKAGE

BACKGROUND OF THE INVENTION

1. Field of the Invention

The present invention relates to a semiconductor device having a structure with pins of the very large number obtained by jointing a new lead frame to a semiconductor chip, and a method of manufacturing the semiconductor device.

2. Description of the Related Art

Figure 1:
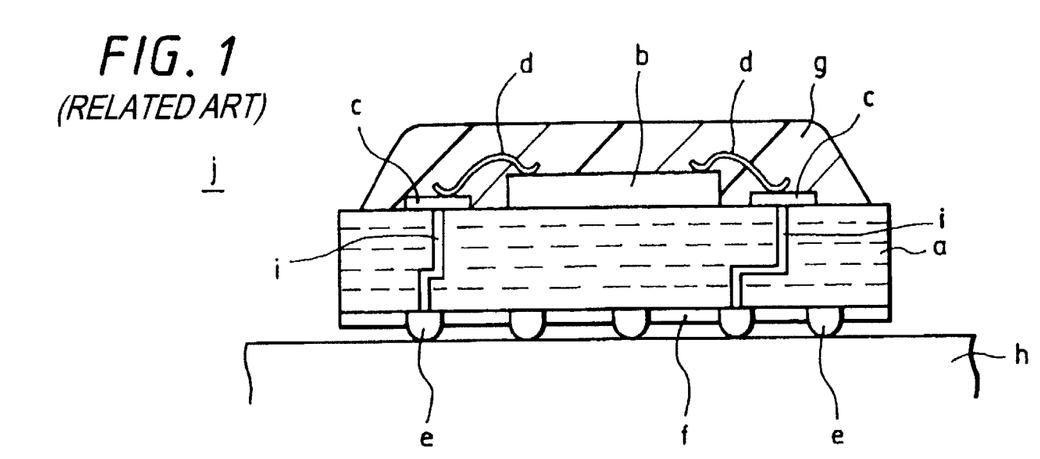
FIG. 1 is a cross-sectional view showing a semiconductor package.

FIG. 1 is a cross-sectional view showing a semiconductor device, i.e., a semiconductor package in which a semiconductor chip can be connected to a circuit board or the like through an organic substrate having a projecting electrode such as a solder ball.

In FIG. 1, an organic multilayer circuit board a having about two to six layers formed of an organic material is mounted on its sur face with a semiconductor tip b. An electrode of the semiconductor tip b and a wiring film c formed on the surface of the organic multilayer circuit board a are connected to each other by wire bonding employing metal wires d or the like.

A solder ball e is provided on a rear surface of the organic multilayer circuit board a and serves as a projecting electrode electrically connected through a through hole i to the wiring film c on the surface of the organic multilayer circuit board a. The solder ball e is faced to the outside through an opening of a solder resist film f. The semiconductor chip b together with the metal wire d are sealed by a sealing resin g.

A semiconductor package j is formed such that the solder balls e formed on the rear surface of the organic multilayer circuit board a is connected to a circuit board h. Being provided with a large number of solder balls e arranged in a grid fashion, the organic multilayer circuit board a is often called a ball grid array (BGA). The semiconductor package j employing the organic multilayer circuit board a is called a BGA package.

The BGA package j employs the wire bonding to connect the electrode of the semiconductor chip b with the wiring film C of the organic multilayer circuit board a. Therefore, this arrangement limits reduction of a pitch between electrode pads of the semiconductor chip b.

Moreover, since a processing for forming the projecting electrodes e of the organic multilayer circuit board a employs a method of physically locating the so-called solder balls, the processing encounters the following problems.

1) When the solder balls e are set at predetermined positions, they are easily displaced therefrom.

2) Since the sizes of the solder balls e are selected by using a sieve or a mesh, the sizes thereof tends to be uneven.

3) There is a limit in achievement of a more minute arrangement pitch between the solder balls e.

4) Since a base of the organic multilayer circuit board a is formed of an insulative substrate, the solder balls e cannot be formed by electroplating which allows the sizes of the solder balls a to be uniform in size and allows pitches therebetween to be more minute.

5) Composition of the soft solder ball is restricted.

The assignee of the present invention proposed a semiconductor package having a structure with pins of a very large number obtained by jointing a new lead frame to a semiconductor chip. A method of manufacturing the above semiconductor package is disclosed in an application filed by the same assignee (U.S. Ser. No. 08/561,245 filed on Nov. 21, 1995).

The semiconductor package is arranged as follows. Specifically, a large number of leads are formed on a surface of a metal base. An insulative film for holding each of the leads is formed at portions other than an inner lead portion. A solder resist film is further formed. A projecting electrode is formed at an end portion of an outer lead portion of each of the leads. Then, the metal base is selectively removed except its outer peripheral joint portion, thereby a lead frame having each of the lead portions separately formed being formed. A semiconductor chip is jointed to an inner lead frame portion of the lead frame. Then, a reinforcement board is bonded to a rear surface of the outer lead portion of the lead frame. The semiconductor chip is sealed with resin. Then, the lead frame is cut at its joint portions to obtain the lead frame. A large number of projecting electrodes are formed in a grid fashion at a peripheral portion around the semiconductor chip.

According to this semiconductor package, since the metal base is employed, the leads and the projecting electrodes can be formed by electroplating. As a result, the leads can be formed in a finer pattern and the projecting electrodes can be prevented from being displaced. Moreover, the size of each of the projecting electrodes can be made uniform and the finer pitches therebetween can be achieved, which enables a large-scale integrated circuit (LSI) to be more downsized and to have pins of the very large number.

A process of manufacturing this semiconductor package encounters the following problem.

Since a chemical processing of a ground is difficult when the solder resist film is formed, the solder resist film and the ground are not bonded to each other satisfactorily, which may lead to the peeling off of the solder resist film during fabrication of the semiconductor package.

When the projecting electrodes are formed by plating, the projecting electrodes on the outer periphery side of the semiconductor package become larger than that formed on the inner periphery side thereof, which may prevent the sizes of the projecting electrodes from being uniform.

SUMMARY OF THE INVENTION

In view of such aspects, it is an object of the present invention to provide a semiconductor device and a method manufacturing the same which prevent a solder resist film from being peeled off and can make sizes of projecting electrodes uniform.

According to a first aspect of the present invention, in a method of manufacturing a semiconductor package, a plurality of leads and a large number of minute convex portions are respectively formed by plating on a surface of a metal base and in an outer peripheral area of the leads thereon. An insulative film for holding each of the leads is formed. A solder resist film is formed selectively on a portion including the outer peripheral area having the minute convex portions thereon. A projecting electrode is formed on an outer lead portion of each of the leads through an opening of the solder resist film on an outer lead portion of each of the leads. The metal base is selectively removed except a joint portion thereof on an outer periphery to separate the respective leads. Inner lead portions of the leads and a semiconductor chip are jointed together. The joint portion of the metal base is cut off.

According to a second aspect of the present invention, in a method of manufacturing a semiconductor package, a plurality of leads are formed on a surface of a metal base by plating. An insulative film for holding each of the leads is formed. A solder resist film is selectively formed. A projecting electrode and a dummy projecting electrode is respectively formed by plating on an outer lead portion of each of the leads and on the outside of the outer lead portion. The metal base is selectively removed except a joint portion thereof at an outer periphery to separate the respective leads. Inner lead portions of the leads and a semiconductor chip are jointed together. The joint portion of the metal base together with the dummy projecting electrode is cut off.

According to a third aspect of the present invention, in a method of manufacturing a semiconductor device, a plurality of leads are formed on a surface of a metal base by plating. An insulative film for holding each of the leads is formed. A large number of minute convex portions are formed at least in an outer peripheral area of a projecting-electrode formed portion. A solder resist film is selectively formed on a portion including the outer peripheral area having the minute convex portions. A projecting electrode and a dummy projecting electrode are respectively formed by plating on an outer lead portion of each of the leads and on the outside of the outer lead portion. The metal base is selectively formed except a joint portion thereof at an outer periphery to separate the respective leads. Inner lead portion of the leads and a semiconductor chip are jointed together. The joint portion of the metal base together with the dummy projecting electrode are cut off.

According to a fourth aspect of the present invention, a semiconductor device includes a plurality of leads, an insulative film for holding each of the leads, a projecting electrode formed on an outer lead portion of each of the leads, a semiconductor chip jointed to inner lead portions of the leads, and a plurality of minute convex portions formed in an outer peripheral area of a portion where the projecting electrode is formed. The solder resist film is selectively formed on a portion including an area having the minute convex portions thereon.

DESCRIPTION OF TEE PREFERRED EMBODIMENTS

Before describing the present invention in detail, the features of the invention are summarized as follows.

A first method of manufacturing a semiconductor package according to the present invention includes a process for respectively forming, by plating, a plurality of leads on a surface of a metal base by plating and a large number of minute convex portions in an outer peripheral area of the leads, a process for forming an insulative film for holding each of the leads, a process for selectively forming a solder resist film on an area including the outer peripheral area having the minute convex portions thereon, a process for forming projecting electrodes on outer lead portions of the respective leads through apertures of the solder resist film, a process for selectively removing the metal base except its joint portions at the outer peripheral portions to separate the respective leads, a process for jointing inner lead portions of the leads and a semiconductor chip together, and a process for cutting off the leads at the joint portions of the metal base.

A second method of manufacturing a semiconductor package according to the present invention includes a process for forming a plurality of leads on a surface of a metal base by plating, a process for forming an insulative film for holding each of the leads, a process for selectively forming a solder resist film, a process for respectively forming projecting electrodes and dummy projecting electrodes on outer lead portions of the respective leads and on the outside of the outer lead portions, a process for selectively removing the metal base except its joint portions at the outer peripheral portions to separate the respective leads, a process for jointing inner lead portions of the leads and a semiconductor chip together, and a process for cutting off the leads at the joint portions of the metal base together with the dummy projecting electrodes.

Moreover, in the first method of manufacturing the semiconductor package, dummy electrodes are simultaneously formed on the outside of the outer lead portions in the process for forming the projecting electrodes on the outer lead portions of the respective leads. In the process for cutting off the joint portions of the metal base, the above joint portions are cut together with the dummy projecting electrodes.

A method of manufacturing a semiconductor device includes a process of forming a plurality of leads on a surface of a metal base by plating, a process of forming an insulative film for holding each of the leads, a process of forming a large number of minute convex portions at least in an outer peripheral area of a projecting-electrode formed portion, a process of selectively forming a solder resist film on a portion including the outer peripheral area having the minute convex portions, a process of respectively forming, by plating, a projecting electrode and a dummy projecting electrode on an outer lead portion of each of the leads and on the outside of the outer lead portion, a process of selectively removing the metal base except a joint portion thereof at an outer periphery to separate the respective leads, a process of jointing inner lead portion of the leads and a semiconductor chip together, and a process of cutting off the joint portion of the metal base together with the dummy projecting electrode.

A semiconductor device includes a plurality of leads, an insulative film for holding each of the leads, a projecting electrode formed on an outer lead portion of each of the leads, a semiconductor chip jointed to inner lead portions of the leads, and a plurality of minute convex portions formed in an outer peripheral area of a portion where the projecting electrode is formed. The solder resist film is selectively formed on a portion including an area having the minute convex portions thereon.

A method of manufacturing a semiconductor package according to an embodiment of the present invention will hereinafter be described with reference to the accompanying drawings.

Figure 2:
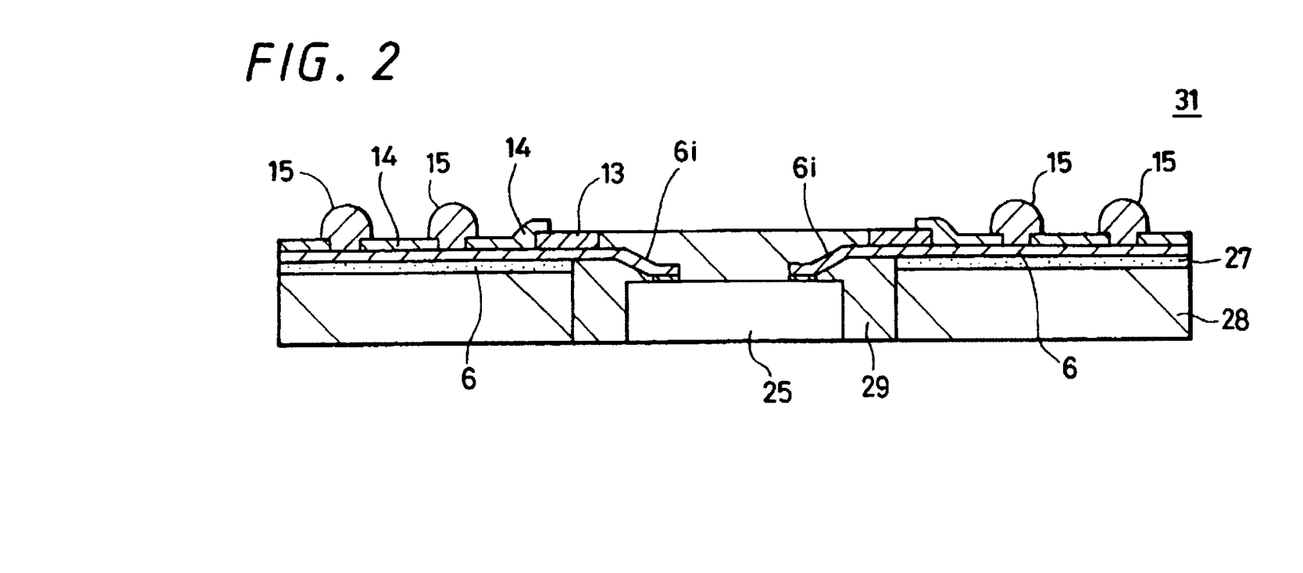
FIG. 2 is a cross-sectional view showing a semiconductor package according to an embodiment of the present invention.
Figure 3:
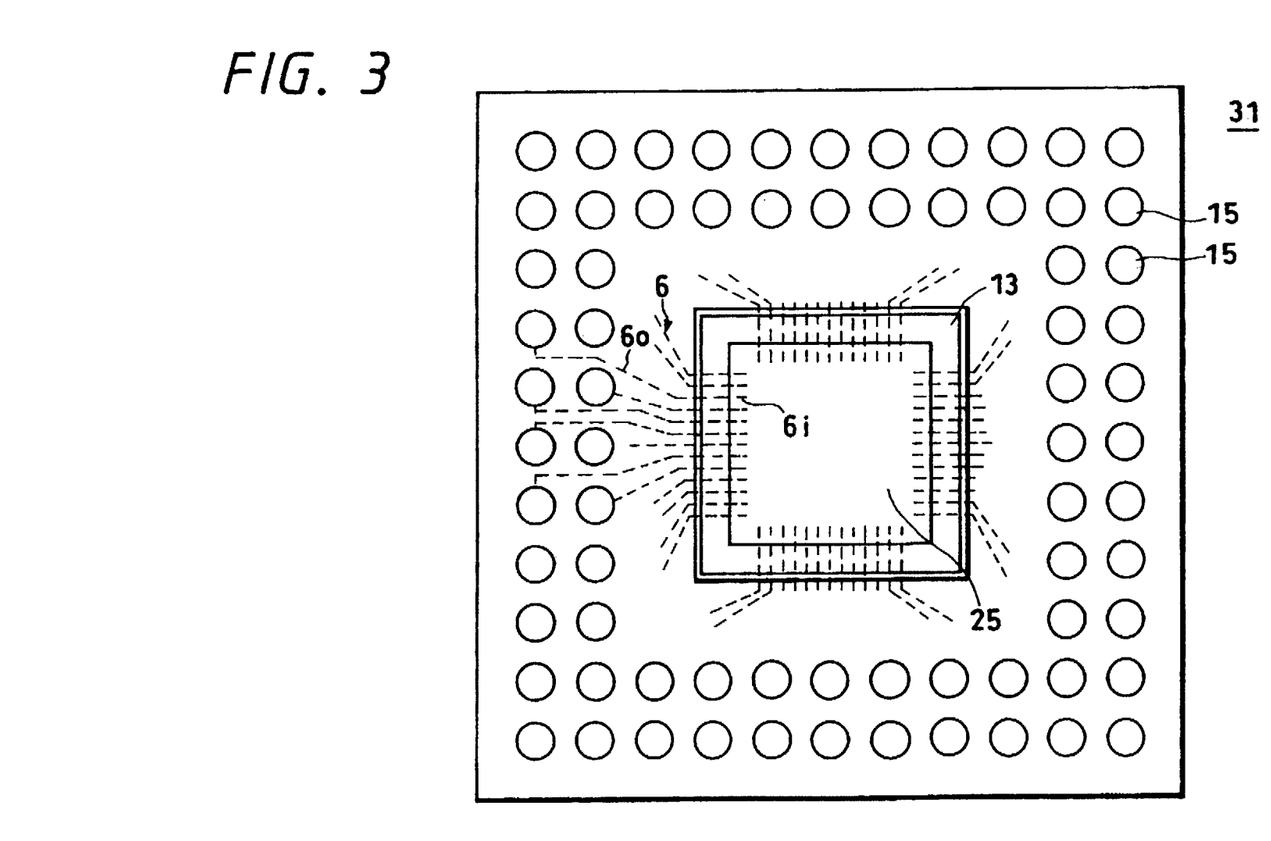
FIG. 3 is a plan view of the semiconductor package according to the embodiment of the present invention.

FIGS. 2 and 3 are respectively cross-sectional and plan views showing a semiconductor package finally obtained by the method according to this embodiment. FIGS. 4A to 4C, 5A to 5C and 6G to 6I are diagrams showing the processes of manufacturing the semiconductor package according to the present invention.

Figure 4A:
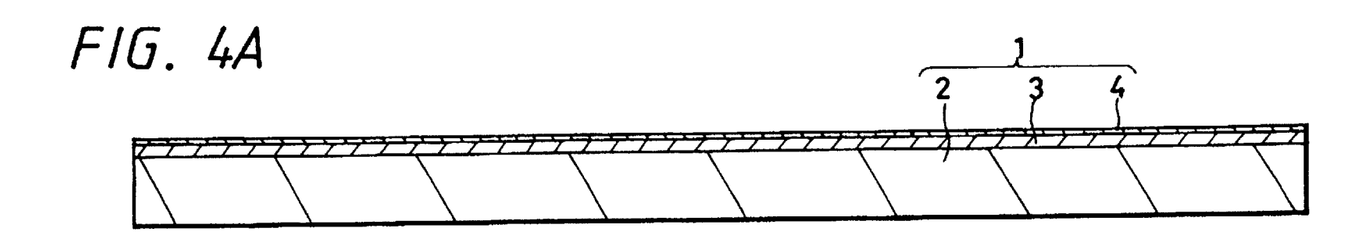
FIGS. 4A to 4C are diagrams showing processes of manufacturing a semiconductor package according to the method of manufacturing a semiconductor package of the embodiment of the present invention.

In this embodiment, as shown in FIG. 4A, a metal base 1 is prepared initially. The metal base 1 is a laminated plate having a trilayer structure formed of a thin plate 2 (hereinafter referred to as a copper substrate 2) made of copper or copper alloy with its thickness of about 150 μm, for example, an aluminum film 3 formed on a surface of the copper substrate 2 with its thickness of about 3 μm, for example, and a thin copper film 4 with its thickness of about 2 μm, for example, formed on a surface of the aluminum film 3.

The aluminum film 3 serves as an etching stopper film which prevents a surface side of the metal base 1 from being etched away when the copper substrate 2 is etched, and also serves as a bump formed at a head end of an inner lead portion of a lead described later on. The thin copper film 4 serves as a ground used upon copper plating for forming the lead. The thin copper film 4 facilitates a satisfactory copper plating. The metal base 1 will not serve as the lead by itself and hence finally becomes unnecessary. However, the metal base 1 is transiently required as a substrate when the very thin lead 6 is formed, and as a lead frame thereafter, and hence serves as a so-called lead forming substrate.

Figure 4B:
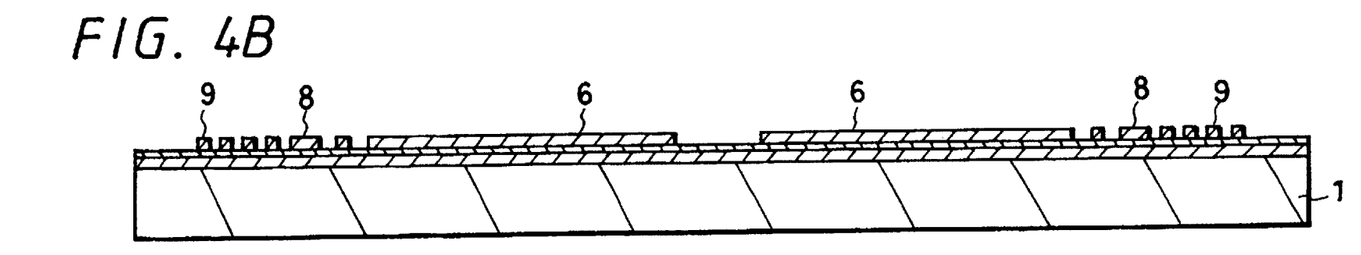
Figure 8:
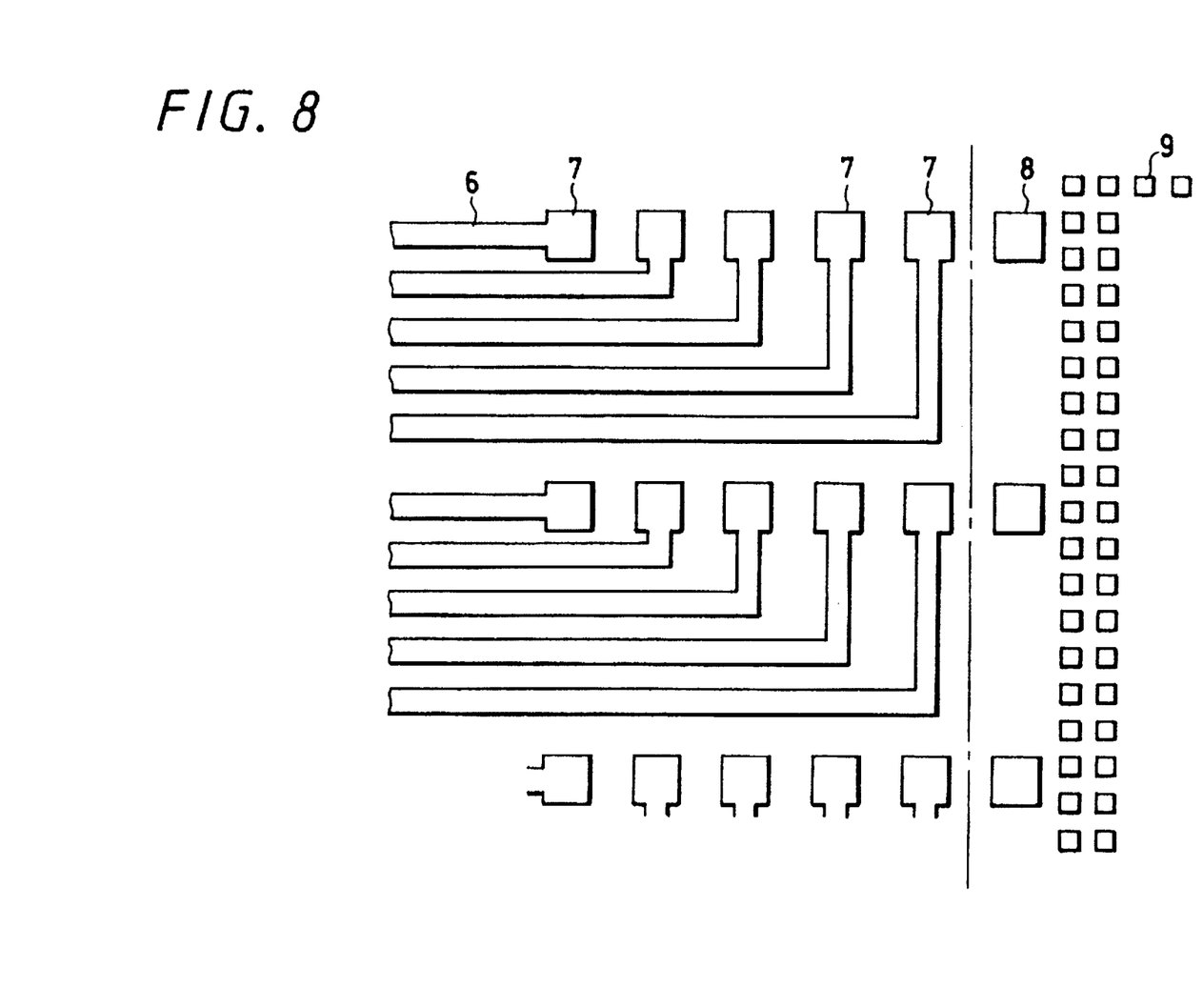
FIG. 8 is a plan view of a main part of the semiconductor package, showing a leads a pad portion, a dummy pad and minute convex portions obtained in the process shown in FIG. 4B.

As shown in FIGS. 4B and 8, a large number of leads made of copper, i.e., a large number of leads 6 integrally having pad portions 7 used for forming projecting electrodes (i.e., solder balls) at their head ends are formed by selective plating on a surface of the metal base 1, i.e., on a surface of the thin copper film 4. Simultaneously, dummy pad portions 8 are formed by the same copper plating on the outer periphery area of the leads 6 so as to be aligned with the pad portions 7 and also minute convex portions 9 are formed by the same copper plating on the outer periphery of the dummy pad portions 8 for achieving their satisfactory bond to a solder resist film to be formed there. The minute convex portions 9 makes the surface of the metal base 1 uneven.

The leads 6 of a large number are formed so as to be extended in all the directions with corresponding to the projecting electrodes formed on all the sides of the semiconductor package. The pad portions 7 formed on the head ends of the leads 6 and the dummy portions 8 are formed on the outer periphery of the leads 6 in a grid fashion.

Figure 4C:
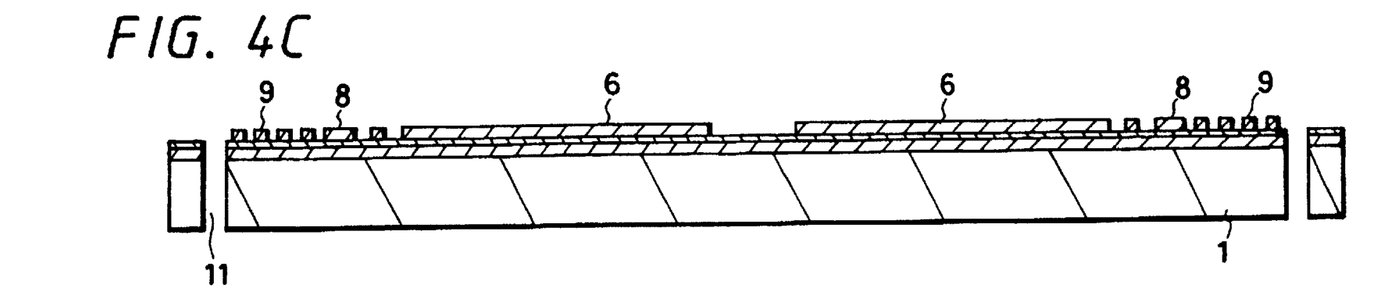

FIGS. 4A to 4C shows the pad portions 7 (not shown) arranged in only two lines for simplification, but FIG. 8 shows the pad portions 7 arranged in five lines as practically arranged.

In the above selective plating, a surface of the thin copper film 4 is selectively covered with a resist film or the like and electrolytic plating is carried out with the resist film being employed as a mask therefor. Thus, when copper is selectively plated on the metal base 1 by electrolytic plating, it is possible to form the leads 6 in a fine pattern with increasing their satisfactory film qualities. In this case, the leads 6 are formed at a pitch of 100 μm, for example, and the minute convex portions 9 as a dummy pattern are formed at a pitch of 50 μm, for example.

Figure 9:
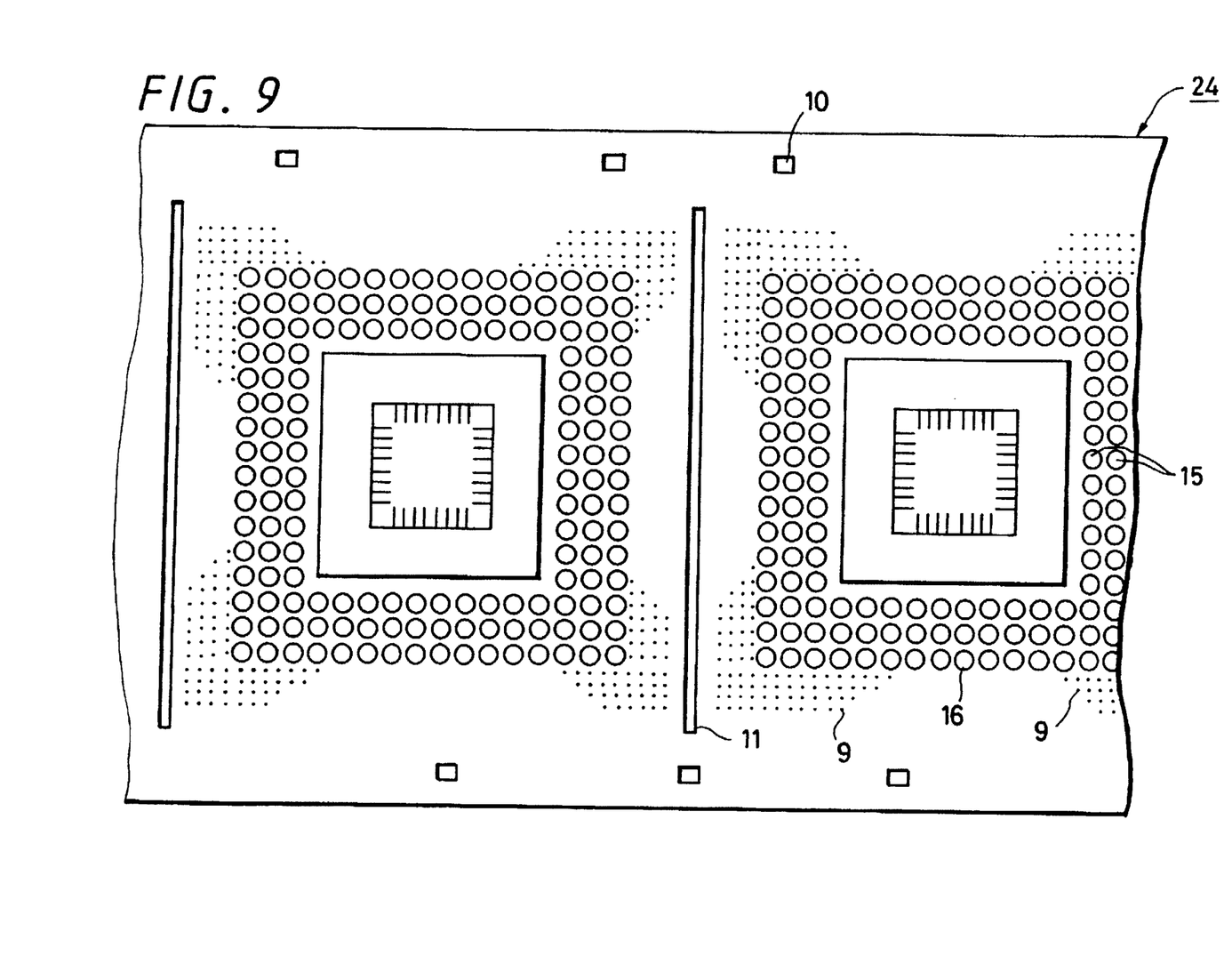
FIG. 9 is a plan view showing a main part of a lead frame according to the present invention.

As shown in FIG. 4C apertures 10 (see FIG. 9) for facilitating fabrication of the semiconductor package and slits 11 used for determining a size of the lead frame with respect to every semiconductor chip are formed at side edge portions of the metal base 1 by selective etching.

Figure 5A:
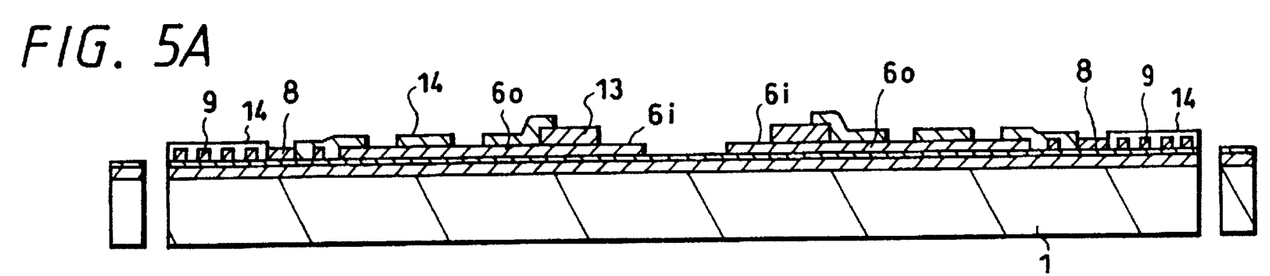
FIGS. 5A to 5C are diagrams showing the processes of manufacturing the semiconductor package according to the method of manufacturing a semiconductor package of the embodiment of the present invention.

AS shown in FIG. 5A, on the surface of the metal base 1 where the leads 6 are formed, an insulating film for finally holding the respective leads 6, e.g., a polyimide film 13 is laminated over positions between inner lead portions 6i and outer lead portions 6o of the respective leads 6. The polyimide film 13 is formed so as to have a shape of a rectangular frame as shown in FIG. 7.

A solder resist film 14 is deposited entirely except for the inner lead portions 6i, the pad portions 7 of the outer lead portions 6o and the dummy pad portions 8. At this time, since an uneven ground for the solder resist film 14 is formed by the minute convex portions 9 in the outer peripheral area of the leads 6, the solder resist film 14 is deposited thereon with its satisfactory bond thereto.

Figure 5B:
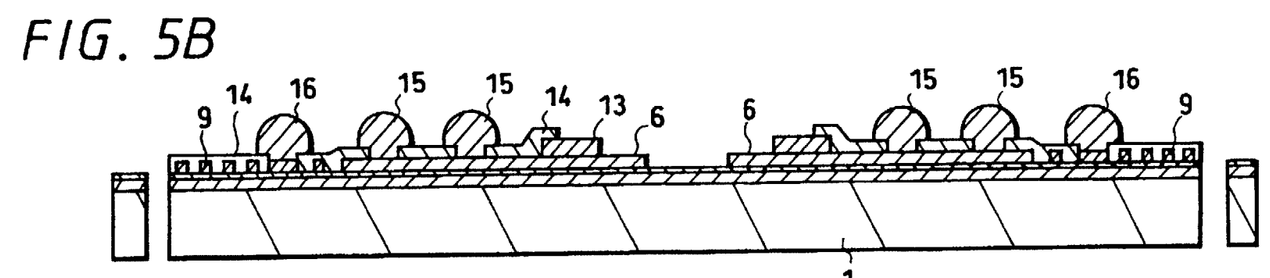
Figure 7:
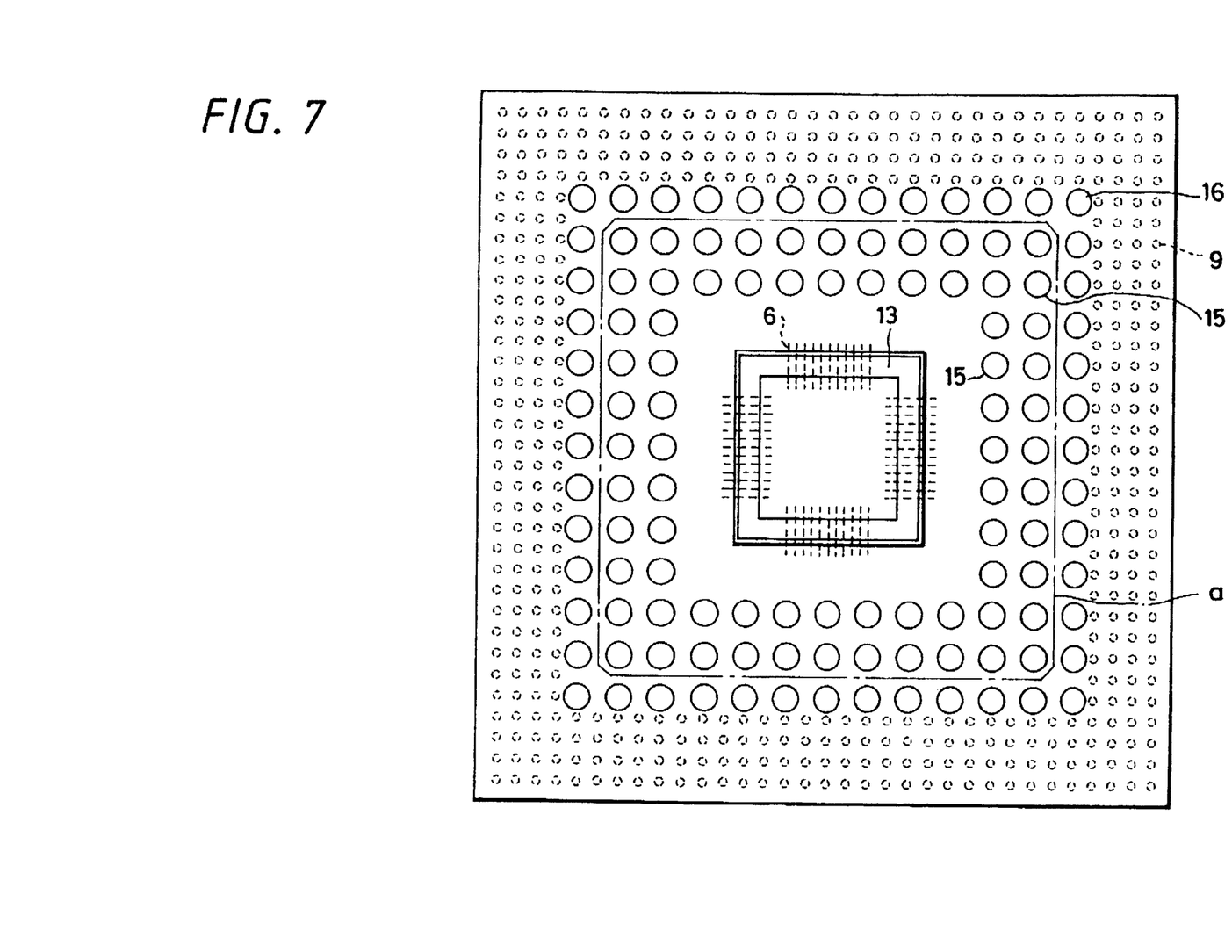
FIG. 7 is a plan view showing a main part of the semiconductor package obtained in the process shown in FIG. 5B.

As shown in FIGS. 5B and 7, projecting electrodes 15 and dummy projecting electrodes 16 formed of solder balls are formed by electrolytic plating on the pad portions 7 at the head end of the outer lead portions 6o of the respective leads 6 and on the dummy pad portions 8.

Figure 10A:
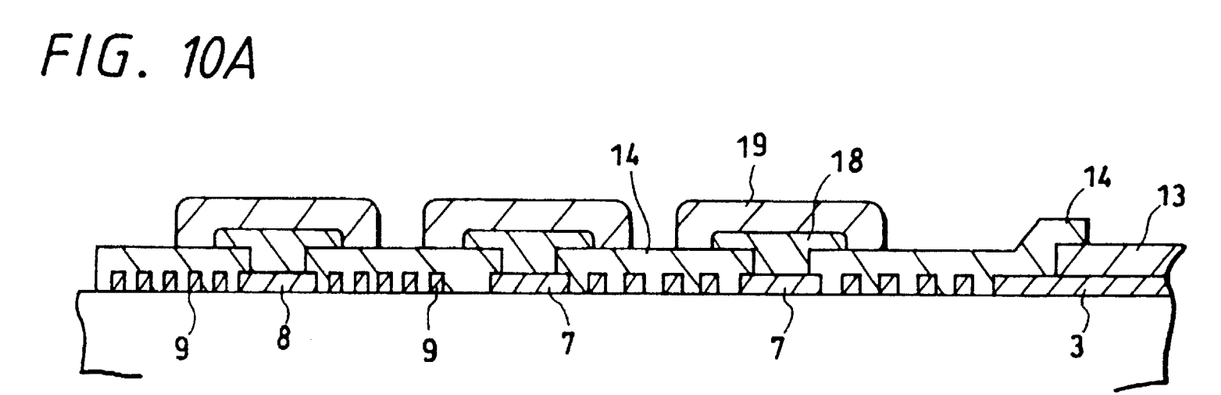
FIGS. 10A and 10B are diagrams showing processes of forming a projecting electrode according to the present invention.
Figure 10B:
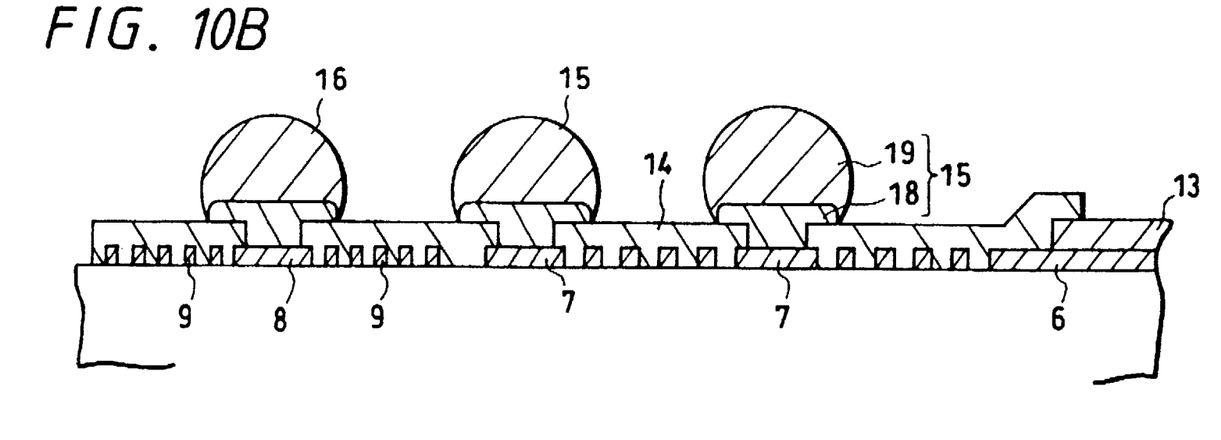

As shown in FIG. 10A, metal ground films 18 made of, for example, copper (Cu), nickel (Ni), gold (Au) or the like are formed on the copper pad portions 7 and the copper dummy pad portions 8 by electrolytic plating. Solder portions 19 made of SnPb alloy (its composition ratio of Sn:Pb is 1:9, 6:4 or the like) are respectively formed on the ground films 18 by plating. Then, the solder portions 19 are subjected to reflowing, thereby being formed so as to be ball-shaped as shown in FIG. 10B. Thus, the projecting electrodes 15 and the dummy projecting electrodes 16 are formed.

Each of the ground films 18 is formed on not only the pad portion 7 and but also on both-side edge portions of the solder resist film 14. The ground film 18 serves as a substantial pad portion used for forming the projecting electrode 15, i.e., the solder ball.

Specifically, the ground film 18 enlarges a substantial area as the pad portion, which improves bonding strength between the ground film 18 and the projecting electrode 15 formed thereon. Since the projecting electrode 15 can be formed partially over the lead 6 as shown in FIG. 10B, the pitch between the projecting electrodes 15 can be reduced more, which leads fabrication of the projecting electrodes 15 with high density.

The ground film 18 may be made of SnPb alloy (its composition ratio of Sn:PB is 1:9, 6:4 or the like), the solder portion 19 having the same composition being formed thereon to obtain the solder ball.

Figure 5C:
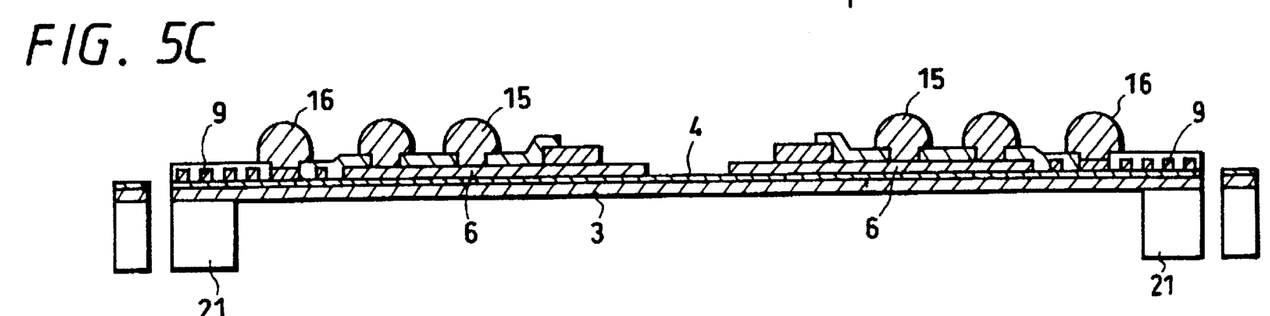

As shown in FIG. 5C, the copper substrate 2 of the metal base 1 is removed by selective etching except its outer peripheral joint portion 21. When this etching is carried out, the aluminum film 3 serves as the etching stopper and allows only the copper substrate 2 to be etched away.

Figure 6G:
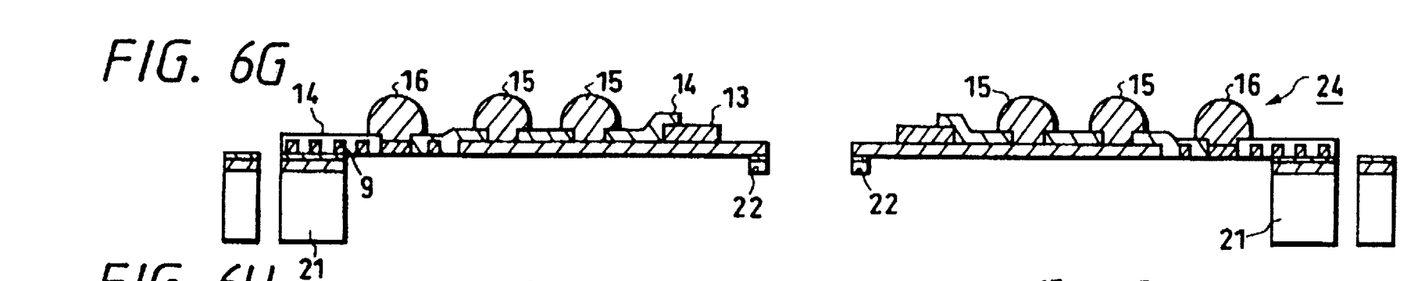
FIGS. 6G to 6I are diagrams showing the processes of manufacturing the semiconductor package according to the method of manufacturing a semiconductor package of the embodiment of the present invention.

AS shown in FIG. 6G, the aluminum film 3 and the thin copper film 4 of the metal base 1 are removed by selective etching to separate the respective leads 6. When the aluminum film 3 and the thin copper film 4 are etched, the selective etching is carried out so that bumps 22 should be left at the head ends of the inner lead portions 6i.

In this state, the outer peripheral joint portions 21 formed of the metal base 1 are held by the solder resist film 14. Thus, a lead frame 24 having a large number of leads 6, the projecting electrodes 15 formed on the ends of the outer lead portions 6o of the leads 6, and the dummy projecting electrodes 16 is formed.

Figure 6H:
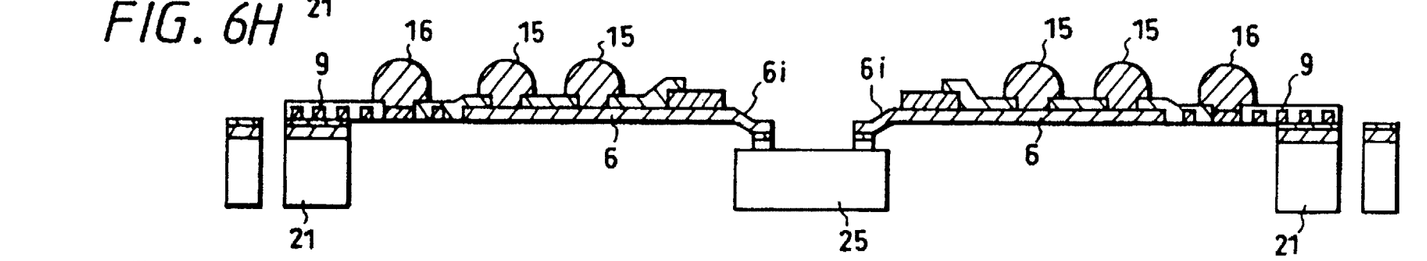

As shown in FIG. 6E, a semiconductor chip 25 is jointed to the lead frame 24. Specifically, the bump 22 at the head of each of the inner lead portions 6i is connected directly to an electrode of the semiconductor chip 25.

Figure 6I:
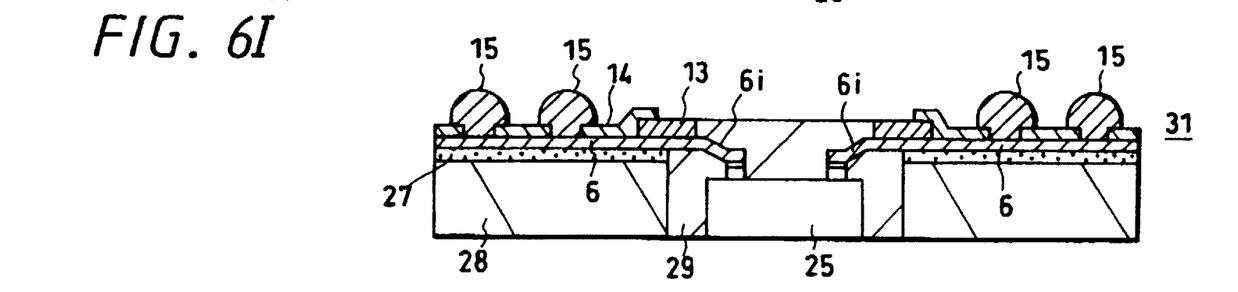

As shown in FIG. 6I, a reinforcement plate, a rigid plate (e.g., aluminum plate) 28 in this embodiment is bonded to a rear surface of the lead frame 24 corresponding to the outer lead portion 6o through an adhesive 27 so as to surround the semiconductor chip 25.

It is desirable to employ as the adhesive 27 a ductile, elastic adhesive having a satisfactory heat radiation and a satisfactory heat conductivity which reduces stress resulting from difference in thermal expansion between the rigid plate 28 and a circuit board to be mounted later and can prevent the bond of the lead 6 to the projecting electrode 15 from being deteriorated due to the above difference in thermal expansion.

After the semiconductor chip 25 is sealed by a resin 29, the lead frame 24 together with the rigid plate 28 is cut at a position a shown by a chain line in FIG. 7 so that the joint portion 21 of the lead frame 24 together with the dummy projecting electrode 16 should be removed.

Thus, a semiconductor package 31 as shown in FIGS. 2, 3 is obtained which has a structure of pins of a very large number in which a large number of projecting electrodes are formed in a grid fashion.

While the minute convex portions 9 are formed in the outer peripheral area of the leads 6 in the arrangement shown in FIG. 7, as shown in FIGS. 10A, 10B, for example, the minute convex portions 9 can be formed such that there remain the minute convex portions 9 at the end edges of the semiconductor package when the lead frame is cut off.

According to this embodiment, when the solder resist film 14 is formed, the minute convex portions 9 are formed by copper plating in at least the outer peripheral area of the leads 6 as the pre-processing therefor to form the uneven ground, which allows the solder resist film 14 formed on the minute convex portions 9 to be more tightly bonded to the minute convex portions 9 and the joint portion 21.

In the process shown in FIG. 6G, this tight bond of the solder resist film 14 to the minute convex portions 9 allows the solder resist film 14 to hold the joint portion 21. Therefore, in the processes succeeding the process shown in FIG. 6G, this tight bond prevents the solder resist film 14 from being peeled off from its end portion.

Since the minute convex portions 9 are formed by plating simultaneously with the process of forming the leads 6, the number of the processes of manufacturing the semiconductor package is not increased.

When the projecting electrodes 15 formed of the solder balls are formed, the dummy electrode 16 is formed on the outside of the outermost projecting electrode 15 by plating simultaneously. Therefore, the projecting electrodes 15 including the outermost projecting electrode 15 can be formed so as to have the same size except that only the dummy projecting electrode 16 at the outermost periphery has a different size. As a result, the sizes of the projecting electrodes 15 can be set uniformly. Specifically, unevenness of the sizes of the projecting electrodes 15 can be made smaller.

When the projecting electrodes 15 are formed by plating, the projecting electrode 15 is prevented from being displaced.

When the projecting electrodes 15 are formed by plating, the ground film 18 having a wider area as compared with the pad portion 7 at the head end of the lead 6 is formed, and thereafter the solder portion 19 which is to be the projecting electrode 15 is formed. Therefore, the projecting electrode (i.e., the solder ball) 15 finally obtained is formed partially over the edge portions of the leads 6, which can reduce the pitch between the projecting electrodes 15. This reduction is effective in more minute pitch required in the high-density mount package.

Since the projecting electrode 15 is formed on the ground film is having a wide area, the ground film 18 serves as the substantial pad portion and improves reliability of the bond of the pad portion to the projecting electrode 15.

Therefore, according to this embodiment, it is possible to manufacture the highly reliable semiconductor package having a small size and the structure having the pins of the very large number.

According to the present invention, the leads 6 are formed by plating, and simultaneously a large number of minute convex portions 9 are formed in the outer peripheral area of the leads 6. The solder resist film 14 is formed on the ground which is made uneven by the minute convex portions 9. Therefore, it is possible to improve the bond of the solder resist film 14 to the ground, and it is possible to prevent the solder resist film 14 from being peeled off during the manufacturing processes.

The projecting electrodes 15 are formed on the outer lead portions 6o of the leads 6 by plating, and simultaneously the dummy projecting electrode 16 is formed on the outside of the outermost projecting electrode 15. Therefore, although only the dummy projecting electrode 16 has a size different from the projecting electrodes 15, it is possible to form the outermost projecting electrodes 15 having the same size as that of each of the inner side projecting electrodes 15, which set the sizes of the projecting electrodes 15 uniformly Since the projecting electrodes 15 are formed by plating, it is possible to form the projecting electrodes 15 with a more minute pitch therebetween.

Having described a preferred embodiment of the present invention with reference to the accompanying drawings, it is to be understood that the present invention is not limited to the above-mentioned embodiment and that various changes and modifications can be effected therein by one skilled in the art without departing from the spirit or scope of the present invention as defined in the appended claims.

What is claimed is:

1. A method of manufacturing a semiconductor package comprising the steps of:

respectively forming, by plating, a plurality of leads on a surface of a metal base and a large number of minute convex portions in an outer peripheral area of said leads;

selectively forming an insulation film on a portion including said outer peripheral area having said minute convex portions thereon;

forming a projecting electrode on an outer lead portion of each of said leads through an opening in said insulation film on an outer lead portion of each of said leads;

selectively removing said metal base except a joint portion thereof on an outer periphery to separate said respective leads;

connecting inner lead portions if said leads and a semiconductor chip together; and cutting off said joint portion of said metal base.

2. A method of manufacturing a semiconductor package comprising the steps of:

forming a plurality of leads on a surface of a metal base by plating;

selectively forming an insulation film;

respectively forming, by plating, a projecting electrode and a dummy projecting electrode on an outer lead portion of each of said leads and on the outside of said outer lead portion;

selectively removing said metal base except a joint portion thereof at an outer periphery to separate said respective leads;

connecting inner lead portions of said leads and a semiconductor chip together; and cutting off said joint portion of said metal base together with said dummy projecting electrode.

3. A method of manufacturing a semiconductor package according to claim 1, wherein a dummy projecting electrode is simultaneously formed outside an outer lead portion of each of said leads in the step of forming a projecting electrode on said outer lead portion of each of said leads, and a joint portion of said metal base together with said dummy projecting electrode is cut off in the step of cutting off said joint portion.

4. A method of manufacturing a semiconductor device comprising the steps of:

forming a plurality of leads on a surface of a metal base by plating;

forming a large number of minute convex portions at least in an outer peripheral area of a projecting-electrode formed portion;

selectively forming an insulation film on a portion including said outer peripheral area having said minute convex portions;

respectively forming, by plating, a projecting electrode and a dummy projecting electrode on an outer lead portion of each of said leads and on the outside of said outer lead portion;

selectively removing said metal base except a joint portion thereof at an outer periphery to separate said respective leads;

connecting inner lead portions of said leads and a semiconductor chip together; and cutting off said joint portion of said metal base together with said dummy projecting electrode.

5. The method of manufacturing a semiconductor package of claim 1, further comprising a step of forming a further insulation film for holding each of said leads.

6. The method of manufacturing a semiconductor package of claim 2, further comprising a step of forming a further insulation film for holding each of said leads.

7. The method of manufacturing a semiconductor device of claim 4, further comprising a step of forming a further insulation film for holding each of said leads.

8. A method of manufacturing a semiconductor package and connecting the package to a printed circuit board comprising the steps of:

respectively forming, by plating, a plurality of package leads on a surface of a metal base and a large number of minute convex portions in an outer peripheral area of said leads;

selectively forming insulation film on a portion including said outer peripheral area having said minute convex portions thereon;

forming a projecting electrode on an outer lead portion of each of said leads through an opening in said insulation film on an outer lead portion of each of said leads;

selectively removing said metal base except a joint portion thereof on an outer periphery to separate said respective leads;

connecting inner lead portions of said leads and a semiconductor chip together;

cutting off said joint portion of said metal base; and connecting a plurality of projecting electrodes to corresponding electrodes on the printed circuit board.

9. A method of manufacturing a semiconductor package and connecting the package to a printed circuit board comprising the steps of:

forming a plurality of leads on a surface of a metal base by plating;

selectively forming an insulation film;

respectively forming, by plating, a projecting electrode and a dummy projecting electrode on an outer lead portion of each of said leads and on the outside of said outer lead portion;

selectively removing said metal base except a joint portion thereof at an outer periphery to separate said respective leads;

connecting inner lead portions of said leads and a semiconductor chip together;

cutting off said joint portion of said metal base together with said dummy projecting electrode; and connecting a plurality of projecting electrodes to corresponding electrodes on the printed circuit board.

10. A method of manufacturing a semiconductor device and connecting the device to a printed circuit board comprising the steps of:

forming a plurality of leads on a surface of a metal base by plating;

forming a large number of minute convex portions at least in an outer peripheral area of a projecting-electrode formed portion;

selectively forming an insulation film on a portion including said outer peripheral area having said minute convex portions;

respectively forming, by plating, a projecting electrode and a dummy projecting electrode on an outer lead portion of each of said leads and on the outside of said outer lead portion;

selectively removing said metal base except a joint portion thereof at an outer periphery to separate said respective leads;

connecting inner lead portions of said leads and a semiconductor chip together;

cutting off said joint portion of said metal base together with said dummy projecting electrode; and connecting a plurality of projecting electrodes to corresponding electrodes on the printed circuit board.

* * * * *